United States Patent [19]
Nakano

[11] Patent Number: 4,871,419
[45] Date of Patent: Oct. 3, 1989

[54] METHOD OF FORMING PATTERN OF A TWO-LAYER METAL FILM

[75] Inventor: Hirofumi Nakano, Hyogo, Japan

[73] Assignee: Mitsubishi Denki Kabushiki Kaisha, Tokyo, Japan

[21] Appl. No.: 125,462

[22] Filed: Nov. 24, 1987

[30] Foreign Application Priority Data

Nov. 24, 1986 [JP] Japan ................ 61-280396

[51] Int. Cl.⁴ .......................................... C23F 1/00
[52] U.S. Cl. .................................. 156/643; 156/648; 156/654; 156/656; 156/659.1; 156/664
[58] Field of Search .......... 156/659.1, 664, 665, 156/662, 648, 654, 656, 657, 643

[56] References Cited

U.S. PATENT DOCUMENTS

| | | | |
|---|---|---|---|
| 4,028,149 | 6/1977 | Deines et al. | 156/654 |
| 4,377,899 | 3/1983 | Otani et al. | 156/659.1 |
| 4,415,606 | 11/1983 | Cynkar et al. | 156/643 |
| 4,420,365 | 12/1983 | Lehrer | 156/643 |
| 4,577,392 | 3/1986 | Peterson | 156/643 |
| 4,631,806 | 12/1986 | Doppert et al. | 156/659.1 |
| 4,670,091 | 10/1987 | Thomas et al. | 156/659.1 |
| 4,678,542 | 7/1987 | Boer et al. | 156/659.1 |
| 4,680,085 | 7/1987 | Vijan et al. | 156/659.1 |
| 4,690,728 | 9/1987 | Tsang et al. | 156/659.1 |
| 4,705,598 | 11/1987 | Itabashi et al. | 156/643 |

*Primary Examiner*—Kenneth M. Schor
*Assistant Examiner*—L. Johnson
*Attorney, Agent, or Firm*—Lowe, Price, LeBlanc, Becker & Shur

[57] ABSTRACT

A first metal film is formed on the major surface of a semiconductor substrate and a thin film which is at least equal in thickness to a second metal film is formed on the first metal film. These films are patterned to provide a two-layer film pattern of a prescribed configuration, and a resist film is coated on the major surface of the semiconductor substrate including the two-layer film pattern. The surface of the resist film is partially removed to expose a thin film pattern serving as an upper layer of the two-layer film pattern, and only the thin film pattern is removed. A second metal film is evaporated over the entire surface of the resist film including the first metal film pattern exposed in the preceding step and thereafter the resist film is removed with the second metal film formed on the same, to form the two-layer metal film pattern by the first metal film pattern and the second metal film pattern.

49 Claims, 5 Drawing Sheets

METHOD OF FORMING PATTERN OF A TWO-LAYER METAL FILM

BACKGROUND OF THE INVENTION

1. Field of the Invention

The present invention relates to a method of forming a pattern of a two-layer metal film, and more particularly, it relates to a method of forming a second metal film on a first metal film pattern provided on the major surface of a semiconductor substrate.

2. Description of the Prior Art

In an electrode or interconnection layer formed on a semiconductor substrate of a semiconductor device, the material for a part being in contact with the semiconductor substrate is restricted in response to treatment of the semiconductor substrate, while the material for another part may be selected in response to the characteristic of the semiconductor device. In other words, required is patterning of a two-layer metal film formed by dissimilar metals. With reference to FIGS. 1A to 1F, description is now made on a conventional method of forming the pattern of such a two-layer metal film.

First, a heat resistant first metal film 2 is deposited entirely over the major surface of a semiconductor substrate 1 as shown in FIG. 1A. The first metal film 2 must be resistant against heat since the semiconductor substrate 1 is subjected to heat treatment in a later step. The deposited first metal film 2 is subjected to photolithography and reactive ion etching (RIE) etc., to provide a first metal film pattern 3 of a prescribed configuration as shown in FIG. 1B. Then the first metal film pattern 3 is utilized as a mask to introduce impurity into prescribed positions on both sides thereof through ion implantation, and the semiconductor substrate 1 is subjected to heat treatment to diffuse the impurity, thereby to form an impurity region 4 as shown in FIG. 1C. After the heat treatment, a resist film 5 is formed entirely over the major surface of the semiconductor substrate 1 including the first metal film pattern 3. An opening 6 is formed in the resist film 5 through photolithography, to expose the upper surface of the first metal film pattern 3. Then, as shown in FIG. 1E, a second metal film 7 is formed entirely over the resist film 5 including the exposed first metal film pattern 3. The second metal film 7 is selected in view of its functional characteristic, dissimilarly to the first metal film 2. Finally the resist film 5 and the second metal film 7 provided on the resist film 5 are removed through a lift-off method to provide a two-layer metal film pattern of a prescribed configuration, which two-layer metal film pattern consists of the first metal film pattern 3 being in contact with the semiconductor substrate 1 and a second metal film pattern 8 formed thereon, as shown in FIG. 1F.

In such a conventional pattern forming method, extremely accurate alignment is required for the photolithography for forming the opening 6 in the resist film 5. In a semiconductor device refined with higher density of integration, however, it is extremely difficult to correctly expose the resist film 5 on the fine first metal film pattern 3 in view of exposure accuracy. Thus, it has been almost impossible to form the second metal film 8 in high accuracy on the fine first metal film pattern 3.

On the other hand, a method of forming a fine gate electrode is disclosed in "Self-Aligned Pt-Buried Gate FET process with Surface Planarization Technique for GaAs LSI" Terada et al.), IEEE GaAs IC Symposium, 1983, pp. 138–141. In this method, an SiO$_2$ layer to be employed as a dummy in pattern formation of the gate electrode is deposited entirely over the major surface of a semiconductor substrate and a cap metal is patterned thereon in a prescribed configuration. The patterned cap metal is utilized as a mask to remove the exposed portion of the SiO$_2$ layer by etching, thereby to provide an SiO$_2$ layer of a prescribed configuration. A resist film is coated entirely over the major surface of the semiconductor substrate including the SiO$_2$ layer, and thereafter the surface of the resist film is etched to expose the upper surface of the SiO$_2$ layer. The exposed SiO$_2$ layer is removed by a plasma etching method to define an opening in the resist film, thereby to form a gate electrode in the opening through a lift-off method.

A similar method of forming a fine gate electrode is disclosed in "A New Self-Align Technology for Low Noise GaAs MESFET's-Sidewall-Assisted Pattern Inversion Technology-" (Hagio et al.) in IEDM Technical Digest, 1984, pp. 194–197.

However, the disclosure in the aforementioned literature is not directed to a method of forming a pattern of a two-layer metal film as in the present invention, but relates to a method of forming a pattern of a single-layer metal film. Further, since the gate electrode is formed by evaporating a metal film in the opening of the resist film formed by utilizing the dummy gate of the SiO$_2$ film, the contact surface between the gate electrode and the major surface of the semiconductor substrate is not stable. In addition, the size of the opening in the resist film is varied with exposure accuracy of the upper surface of the dummy gate, to influence size accuracy of the gate electrode.

Thus, the aforementioned prior art examples have none of advantages obtained by the present invention upon application to formation of a gate electrode, such as stable contact between a previously formed first metal film pattern and the major surface of a semiconductor substrate, assurance of width of the first metal film pattern serving as a lower layer of the gate electrode in high accuracy.

SUMMARY OF THE INVENTION

The principal object of the present invention is to provide a method of forming an opening of high accuracy in a resist film provided on a fine first metal film pattern, i.e., a method of pattern formation which can accurately form a second metal film pattern on a fine first metal film pattern.

In order to attain the aforementioned object, the pattern forming method according to the present invention comprises a step of forming a first metal film entirely over the major surface of a semiconductor substrate, a step of forming a thin film entirely over the first metal film, a step of patterning the first metal film and the thin film to form a two-layer film pattern of a prescribed configuration, a step of forming a resist film over the major surface of the semiconductor substrate including the two-layer film pattern, a step of removing the upper surface of the resist film to expose the upper surface of the two-layer film pattern, a step of removing only the thin film portion forming the upper layer of the exposed two-layer film pattern, a step of forming a second metal film on the resist film including the first metal film exposed by removal of the thin film, and a step of removing the resist film with the second metal film formed on the resist film.

A two-layer film pattern formed by first and second metal films can be easily and accurately patterned by the pattern forming method based on the aforementioned steps. Since the first metal film and the insulation thin film forming the composite film pattern are integrally patterned, the thin insulation film defines a space at least equal in thickness to a second metal film to be formed thereafter. The thin insulation film remains on the first metal film in high consistency even if the first metal film is extremely finely patterned. The second metal film is formed on the exposed first metal film through an opening of a resist film defined by removing the thin film, whereby no misalignment takes place between the first metal film serving as a lower layer and the second metal film serving as an upper layer.

Further, the two-layer metal film patterned by the pattern forming method according to the present invention can be applied to a gate electrode forming a field effect transistor with great advantages. The first metal film formed entirely over the major surface of the semiconductor substrate and patterned thereafter directly remains to partially form the two-layer metal film, whereby excellent contact can be attained between the same and the semiconductor substrate. Further, the first metal film adapted to serve as a lower layer of the gate electrode can be prepared by a metal having a high melting point as a material responsive to processing such as heat treatment of the semiconductor substrate while the second metal film adapted to serve as an upper layer of the gate electrode formed after the heat treatment of the semiconductor substrate can be prepared by a metal of low resistance, thereby to improve reliability and operating speed of the semiconductor device. In addition, formation accuracy of extremely important gate width, which controls the channel effect of the gate electrode, is not in the least influenced by the manner of formation of the second metal film, whereby the performance characteristic of the semiconductor device requiring fine gate width is extremely improved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2I are sectional views showing principal steps in a method of forming a pattern of a two-layer metal film on the major surface of a semiconductor substrate according to an embodiment of the present invention.

DESCRIPTION OF THE PREFERRED EMBODIMENTS

FIGS. 2A to 2I are sectional views showing principal stages of a method of forming a pattern of a two-layer metal film according to an embodiment of the present invention. Referring to FIGS. 2A to 2I, description is now made on the inventive pattern forming method.

Figure 1A:
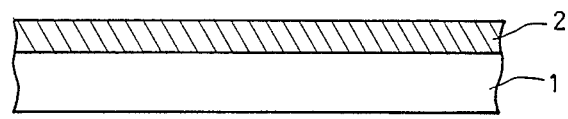
FIGS. 1A to 1F are sectional views showing principal steps in a conventional method of forming a pattern of a two-layer metal film on the major surface of a semiconductor substrate.
Figure 1B:
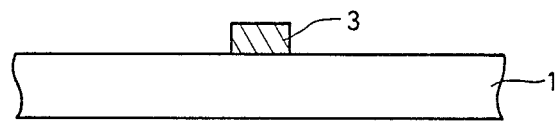
Figure 1C:
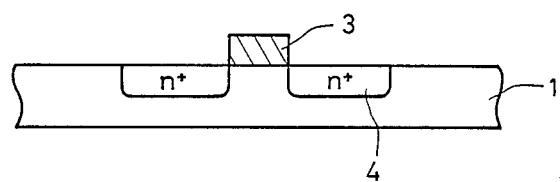
Figure 1D:
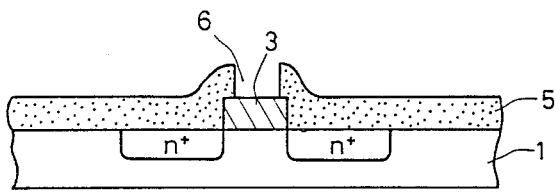
Figure 1E:
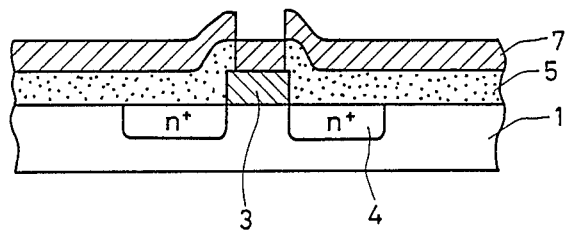
Figure 1F:
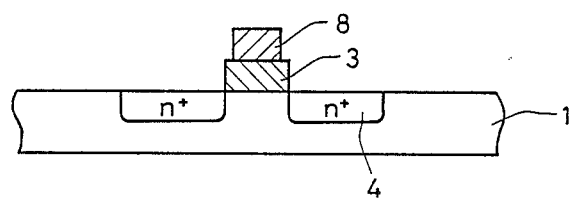
Figure 2A:
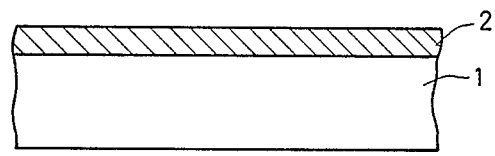
Figure 2B:
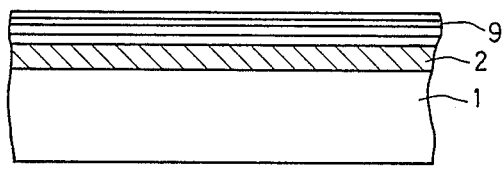
Figure 2C:
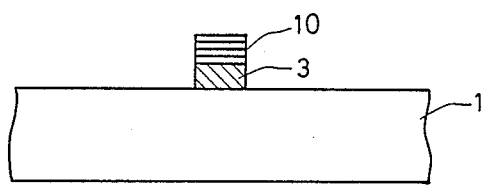
Figure 2D:
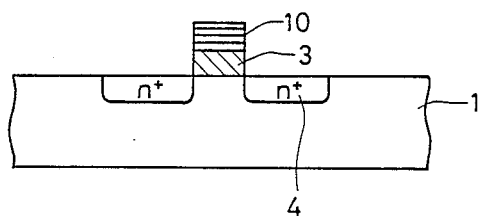

First, as shown in FIG. 2A, a first metal film 2 of a metal having a high melting point such as tungsten silicide (WSi) is formed entirely over the major surface of a semiconductor substrate 1 of GaAs etc. by sputtering. Then, as shown in FIG. 2B, a thin film 9 of silicon oxide ($SiO_2$) is formed entirely over the first metal film 2 by a plasma CVD (chemical vapor deposition) method. The thin film 9 must be at least equal in thickness to a second metal film formed in a later step. The two-layer film formed by the first metal film 2 and the thin film 9 is patterned through photolithography and reactive ion etching (RIE), to provide a two-layer film pattern of prescribed configuration formed by a first metal film pattern 3 and a thin film pattern 10, as shown in FIG. 2C. The two-layer film pattern is utilized as a mask to introduce prescribed impurity into the semiconductor substrate 1 through ion implantation, which impurity is diffused by heat treatment to form an impurity region 4 as shown in FIG. 2D. The impurity region 4 is adapted to provide a source region or a drain region of a field effect transistor (FET).

Figure 2E:
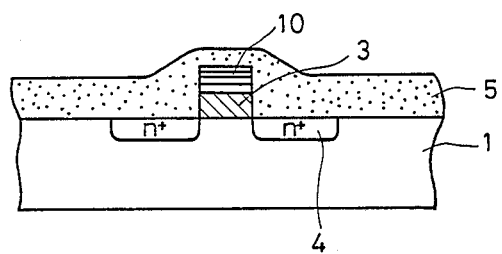

After the heat treatment, a positive type resist film 5 is coated entirely over the major surface of the semiconductor substrate 1. At this time, the resist film 5 is so coated as to cover the two-layer film pattern formed by the first metal film pattern 3 and the thin film pattern 10 as shown in FIG. 2E. Then the coated resist film 5 is exposed in such an exposure value that the same is photosensitized only by thickness covering the two layer film pattern.

Figure 2F:
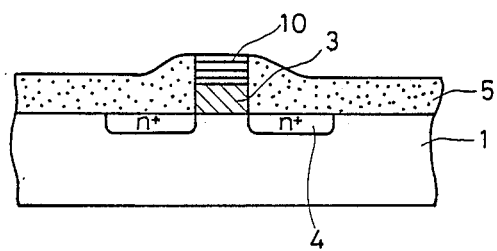
Figure 2G:
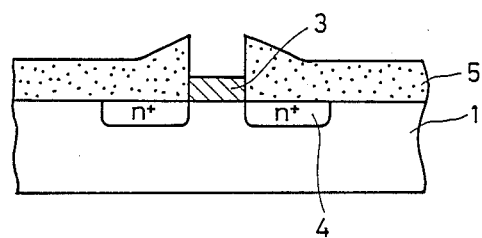
Figure 2H:
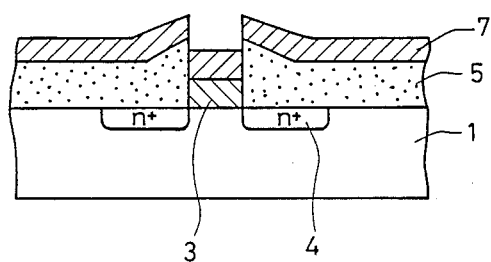
Figure 21:
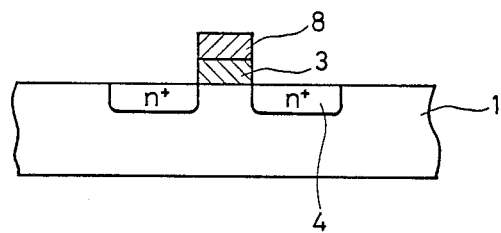

After the exposure process, the resist film 5 is developed so that only the photosensitized portion is removed, whereby the surface of the thin film pattern 10 forming the two-layer film pattern is exposed as shown in FIG. 2F. Then this substance is dipped in a chemical for dissolving the exposed thin film pattern 10 but not dissolving the resist film 5 and the first metal film pattern 3, so that only the thin film pattern 10 is dissolved and removed to expose the first metal film pattern 3 enclosed by the resist film 5. In this state, a second metal film 7 of a low resistance metal such as gold (AU) is evaporated on the entire surface of the substance, whereby second metal films are formed on the first metal film pattern 3 and the resist film 5 respectively as shown in FIG. 2H.

Finally the resist film 5 and the second metal film 7 formed thereon are removed by a lift-off method, to provide a two-layer metal film pattern of a prescribed configuration, which comprises the first metal film pattern 3 and a second metal film pattern 8 accurately formed thereon as shown in FIG. 2I.

The two-layer metal film pattern is applied to a gate electrode of a field effect transistor in the above embodiment, while the present invention is applicable to any case of finely patterning a two-layer metal film formed by dissimilar metals. Such case may not include the step of introducing impurity into the semiconductor substrate through ion implantation and performing heat treatment of the same.

Although the resist film 5 is partially removed by chemical etching in order to expose the thin film pattern 10 in the step as shown in FIG. 2F, such removal may be performed through other well-known methods such as reactive ion etching (RIE).

In order to form a two-layer film pattern in the step as shown in FIG. 2C through a general method, the thin film 9 may be temporarily patterned to be in a prescribed configuration on the basis of a photomask formed on the thin film 9, to thereafter remove the exposed first metal film 2 through reactive ion etching (RIE), for example, by utilizing the thin film pattern 10 of a prescribed configuration as a mask.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a pattern of a two-layer metal film, said method comprising
   preparing a semiconductor substrate having a major surface;
   forming a composite film pattern of a prescribed configuration consisting of a first metal film and a thin insulation film on said major surface of said semiconductor substrate, said pattern including therewithin a lower layer of a first metal film pattern formed by said first metal film and an upper layer of a thin film pattern formed by said thin insulation film, said thin insulation film defining a space at least equal in thickness to a second metal film to be formed thereafter;
   forming a resist film on said major surface of said semiconductor substrate to be in contact with the periphery of said composite film pattern, the thickness of said resist film being at least equal to the sum of the thickness of said first metal film and that of said second metal film;
   removing both the portion of said resist film formed on said composite film pattern and said thin film pattern from said composite film pattern to expose said first metal film pattern;
   thereafter forming said second metal film on said exposed first metal film pattern left by removal of said thin film pattern and said resist film; and
   removing said resist film with the portion of said second metal film formed on said resist film.

2. The method of claim 1, wherein
   said step of forming said two-layer film pattern includes a step of performing photolithography.

3. The method of claim 1, wherein
   said first metal film is prepared from a metal having a high melting point.

4. The method of claim 3, wherein
   said metal having a high melting point is tungsten silicide (WSi).

5. The method of claim 1, wherein
   said insulation film is prepared from silicon oxide (SiO$_2$).

6. The method of claim 1, wherein
   said thin film pattern is removed through chemical etching.

7. The method of claim 6, wherein
   the etchant for said chemical etching exerts no influence on said first metal film pattern and the remainder of said resist film.

8. The method of claim 1, wherein
   said second metal film is prepared from a metal of low resistance.

9. The method of claim 8, wherein said metal of low resistance is gold (Au).

10. The method of claim 9, wherein
    said second metal film is formed by an evaporation method.

11. The method of claim 1, wherein
    said step of forming said second metal film and said step of removing said resist film with said second metal film formed on said resist film are based on a lift-off method.

12. A method of forming a pattern of a two-layer metal film, said method comprising
    preparing a semiconductor substrate having a major surface;
    forming a composite film pattern of a prescribed configuration consisting of a first metal film and a thin insulation film on said major surface of said semiconductor substrate, said composite film pattern consisting of a lower layer of a first metal film pattern formed by said first metal film and an upper layer of a thin film pattern formed by said thin insulation film, said thin insulation film defining a space at least equal in thickness to a second metal film to be formed thereafter;
    forming a resist film on said major surface of said semiconductor substrate including said composite film pattern;
    partially removing said resist film formed on said composite film pattern to expose the upper surface of said thin film pattern;
    removing said thin film pattern;
    thereafter forming said second metal film on said first metal film pattern exposed by removal of said thin film pattern and on said resist film; and
    removing said resist film with said second metal film formed on said resist film.

13. The method of claim 12, wherein
    said step of forming said two-layer film pattern comprises photolithography.

14. The method of claim 12, wherein
    said first metal film is prepared from a metal having a high melting point.

15. The method of claim 12, wherein
    said metal having a high melting point is tungsten silicide (WSi).

16. The method of claim 12, wherein
    said insulation film is prepared from silicon oxide (SiO$_2$).

17. The method of forming a pattern of a two-layer metal film in accordance with claim 12, wherein
    said resist film is prepared form a positive type resist.

18. The method of claim 17 wherein
    said resist film formed on said two-layer film pattern is removed by exposure technique.

19. The method of claim 18, wherein
    at least a part of said resist film being positioned upward beyond the upper surface of said two-layer film pattern is exposed.

20. The method of claim 12, wherein
    said resist film formed on said two-layer film pattern is partially removed by dry etching.

21. The method of claim 20, wherein
    said dry etching is reactive ion etching (RIE).

22. The method of claim 12, wherein
    said thin film pattern is removed by chemical etching.

23. The method of forming a pattern of a two-layer metal film in accordance with claim 22, wherein
    the etchant for said chemical etching exerts no influence on said first metal film pattern and the remainder of said resist film.

24. The method of claim 12, wherein
    said second metal film is prepared from a metal of low resistance.

25. The method of claim 24, wherein
    said metal of low resistance is gold (Au).

26. The method of claim 25, wherein
    said second metal film is formed by an evaporation method.

27. The method of claim 12, wherein
said step of forming said second metal film and said step of removing said resist film with said second metal film formed on said resist film are based on a lift-off method.

28. A method of forming a pattern of a two-layer metal film, said method comprising
preparing a semiconductor substrate having a major surface;
forming a first metal film on said major surface of said semiconductor substrate;
forming a thin insulation film on said first metal film, said thin insulation film defining a space at least equal in thickness to a second metal film to be formed thereafter;
patterning said first metal film and said thin film to form a composite film pattern of a prescribed configuration consisting of a lower layer of a first metal film pattern formed by said first metal film and an upper layer of a thin film pattern formed by said thin insulation film;
forming a resist film on said major surface of said semiconductor substrate including said composite film pattern;
partially removing said resist film formed on said composite film pattern to expose the upper surface of said thin insulation film pattern;
removing said thin film pattern;
thereafter forming said second metal film on said first metal film pattern exposed by removal of said thin insulation film pattern and on said resist film; and
removing said resist film with said second metal film formed on said resist film.

29. The method of claim 28, wherein
said first metal film is prepared from a metal having a high melting point.

30. The method of claim 29, wherein
said metal having a high melting point is tungsten silicide (WSi).

31. The method of 30, wherein
said first metal film is formed by sputtering.

32. The method of forming a pattern of a two-layer metal film in accordance with claim 31, wherein
said insulation film is prepared from silicon oxide (SiO$_2$).

33. The method of claim 32, wherein
said thin film is formed by a plasma CVD method.

34. The method of claim 28, wherein the step of forming said two-layer film pattern comprises
patterning said thin film to form a thin film pattern of a prescribed configuration; and
removing said exposed first metal film by utilizing said thin film pattern as a mask.

35. The method of claim 34, wherein
said first metal film is removed by dry etching.

36. The method of claim 35, wherein
said dry etching is reactive ion etching (RIE).

37. The method of claim 28, wherein
said resist film is prepared from a positive type resist.

38. The method of claim 37, wherein
said resist film formed on said two-layer film pattern is partially removed by exposure technique.

39. The method of claim 38, wherein
at least a part of said resist film positioned upward beyond the upper surface of said two-layer film pattern is exposed.

40. The method of claim 38, wherein
said resist film formed on said two-layer film pattern is partially removed by dry etching.

41. The method of claim 40, wherein
said dry etching is reactive ion etching (RIE).

42. The method of claim 38, wherein
said thin film pattern is removed by chemical etching.

43. The method of claim 42, wherein
the etchant for said chemical etching exerts no influence on said first metal film pattern and said resist film.

44. The method of claim 38, wherein
said second metal film is prepared from a metal of low resistance.

45. The method of claim 44, wherein said metal of low resistance is gold (Au).

46. The method of claim 45, wherein
said second metal film is formed by an evaporation method.

47. The method of claim 28, wherein
the step of forming said second metal film and the step of removing said resist film with second metal film formed on said resist film are based on a lift-off method.

48. The method of claim 28, wherein the step of forming said two-layer film pattern further comprises
implanting impurity ions into said major surface of said semiconductor substrate by utilizing said two-layer film pattern as a mask; and
heating to diffuse said implanted impurity ions and form impurity regions.

49. The method of claim 48, wherein
said first metal film pattern, said second metal film formed on said first metal film pattern, and said impurity regions are adapted to form a field effect transistor.

* * * * *